United States Patent [19]

Ige et al.

[11] Patent Number: 5,237,300
[45] Date of Patent: Aug. 17, 1993

[54] SUPPORT STRUCTURE FOR ACTIVELY SHIELDED SUPERCONDUCTING MAGNETS

[75] Inventors: Oluwasegun O. Ige, Florence, S.C.; John J. Wollan, Golden, Colo.; Yannis P. Tsavalas, Florence, S.C.

[73] Assignee: General Electric Company, Milwaukee, Wis.

[21] Appl. No.: 923,432

[22] Filed: Aug. 3, 1992

[51] Int. Cl.$^5$ .......................... H01F 5/00; H01F 7/00; G01V 3/00
[52] U.S. Cl. .................................. 335/299; 324/319; 335/216
[58] Field of Search ............... 335/216, 296, 297, 298, 335/299, 300, 301; 62/15.1, 15.2, 15.3; 505/879, 892, 893, 898; 324/318, 319, 320

[56] References Cited

U.S. PATENT DOCUMENTS 4,595,899  6/1986  Smith et al. .......................... 335/216
4,896,128  1/1990  Wollan ................................. 335/299

Primary Examiner—Leo P. Picard
Assistant Examiner—Raymond Barrera
Attorney, Agent, or Firm—Irving Freedman; James O. Skarsten

[57] ABSTRACT

A cantilevered trapezoidal-toroidal structure is provided in an active magnetic shielding system for a superconducting magnet to support the bucking magnet coils in spaced relationship to the main magnet coils.

16 Claims, 3 Drawing Sheets

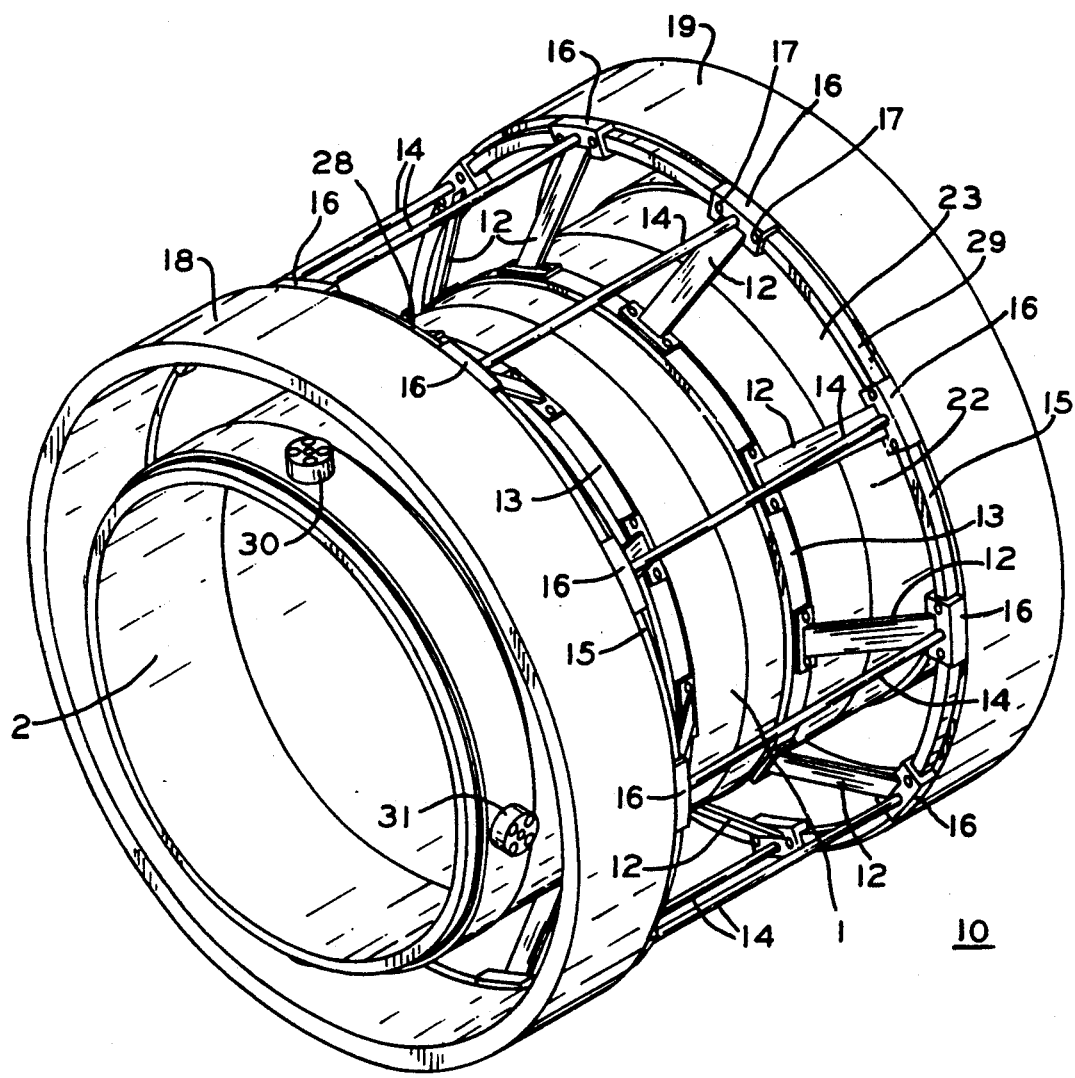
FIG_1

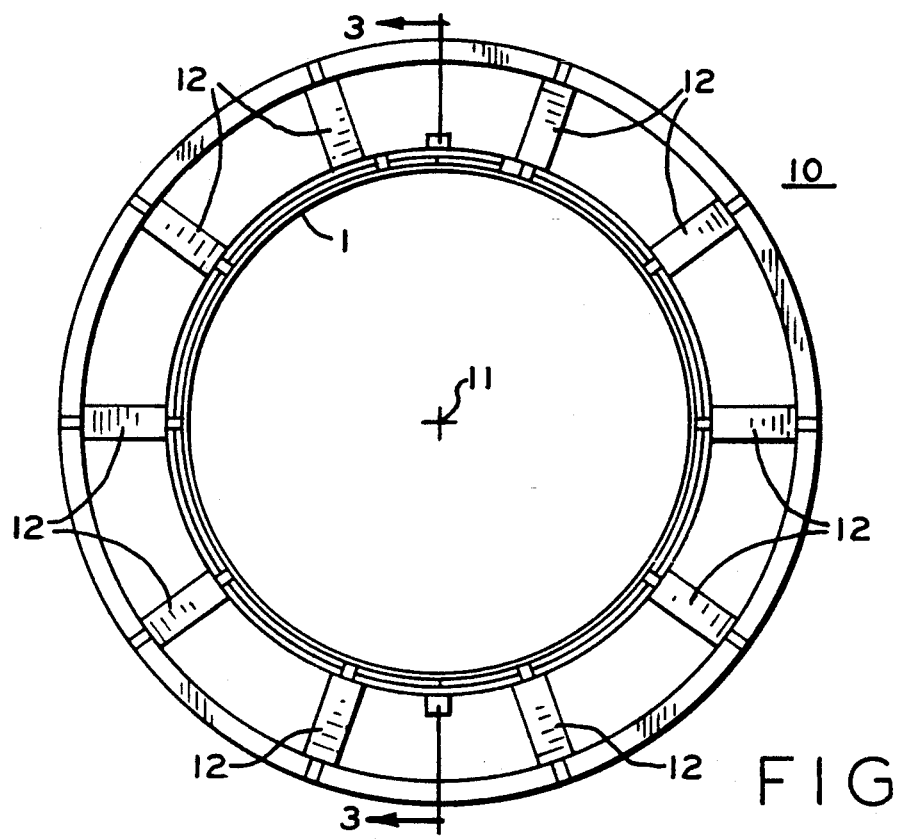
FIG_2
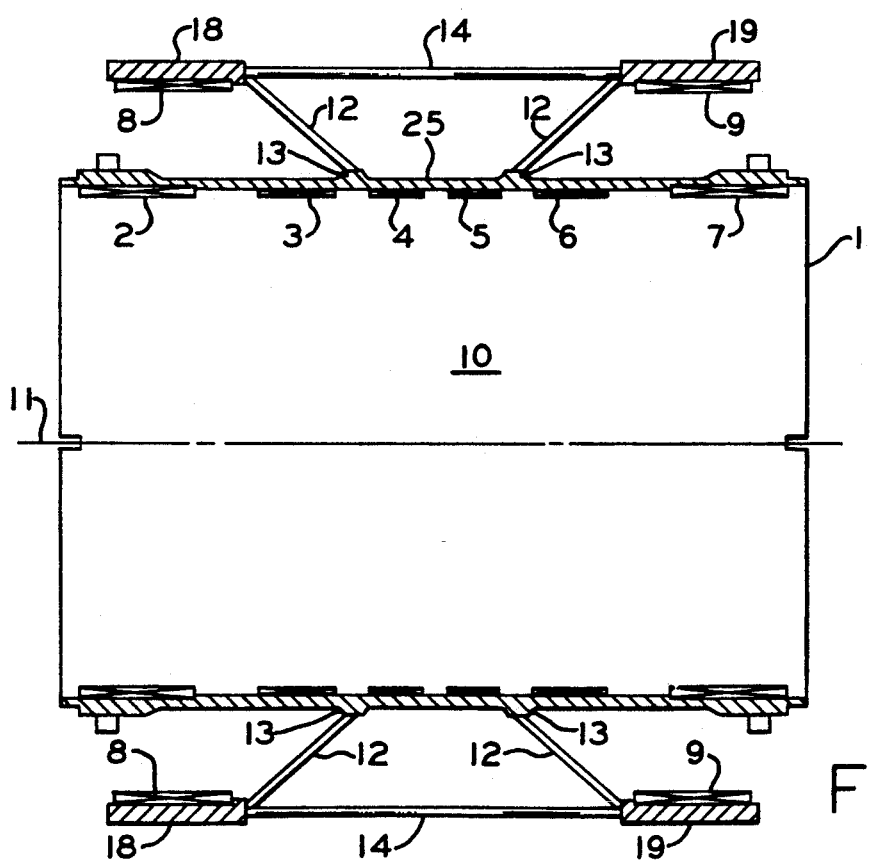
FIG_3

SUPPORT STRUCTURE FOR ACTIVELY SHIELDED SUPERCONDUCTING MAGNETS

BACKGROUND OF THE INVENTION

This invention relates to a support structure for superconducting magnets, particularly suitable for supporting the bucking magnet coils of an active magnetic shielding system.

As is well known, a magnet, if wound with wire possessing certain characteristics, can be made superconducting by placing it in an extremely cold environment, such as by enclosing it in a cryostat or pressure vessel containing liquid helium or other cryogen. The extreme cold reduces the resistance in the magnet coils to negligible levels, such that when a power source is initially connected to the coil (for a period, for example, of ten minutes) to introduce a current flow through the coils, the current will continue to flow through the coils due to the negligible resistance even after power is removed, thereby maintaining a magnetic field. Superconducting magnets find wide application, for example, in the field of magnetic resonance imaging (hereinafter "MRI").

Bucking magnet coils are auxiliary magnet coils provided proximate to the main magnet coils to shield the magnetic field produced by the main magnets, even in the presence of surrounding magnetic structures and/or magnetic flux emitting devices. The support structure for the main magnet coils is an annular cylindrical aluminum drum. The main coils are wound separately around stainless steel bobbins, placed in grooves machined in the drum, and are spaced axially along the inside of the drum. The bucking coils are annular coils spaced from, and surrounding, the main coils by a support structure secured to the drum, and carry currents in the direction opposite to that carried by the main coils to reduce the stray magnetic field outside the magnet. This is called active magnetic shielding.

However, in the process of energizing the magnets, or ramping the magnets to field, and in cooling the coils to superconducting temperatures, the coils are subjected to significant thermal and electromagnetic loading. As a result, actively shielded magnets pose difficult problems in terms of structural support. The principal reason for utilizing active magnets, as opposed to a passively shielded system, is that the latter would require massive amounts of magnetic material, such as iron, around the magnet, providing considerable increases in weight and volume. However, to minimize weight and volume through use of bucking coils, and thus realize the objectives of active magnetic shielding, it is important that the support structure for the bucking coils be relatively lightweight and yet withstand the significant magnetic and thermal loads placed upon it in an MRI. It is also important that the bucking coils maintain close positional accuracy, notwithstanding the significant thermal loads during initial operation or cooldown of the MRI, and notwithstanding the electromagnetic loads generated during energization and operation.

As a result, there are conflicting thermal, magnetic and mechanical considerations and factors which must be balanced and compromised to obtain an acceptable bucking coil assembly.

OBJECTS AND SUMMARY OF THE INVENTION

Accordingly, a primary object of the present invention is to provide a new and improved bucking coil magnetic shielding assembly for a superconducting magnet.

It is a further object of the present invention to provide a support structure for the bucking coils in a superconducting magnet active shielding assembly which will withstand the extreme variations in electromagnetic and thermal forces.

It is another object of the present invention to provide an improved superconducting magnet bucking coil structure which minimizes movement of the bucking coils in the presence of strong electromagnetic forces.

To attain the above and other related objectives, in carrying out the present invention in one form thereof, the main magnet coils are assembled in a tubular drum and a plurality of annular bucking coils are concentrically positioned about the main magnet coils with a support structure extending between the drum and the bucking coils. The bucking coils are positioned accurately on coil supports with a plurality of struts secured between the drum and the coil supports and a plurality of spacer rods extending axially between the bucking coil supports. The struts and spacer rods are both connected to end regions of the bucking coil supports to provide a cantilevered support. The struts extend both in the radial and axial directions relative to the axis of the drum, forming a substantially isosceles trapezoidal cross section, and both the struts and spacer rods connect to a fastening member which is generally U-shaped in cross section and is secured to the end of the coil supports.

BRIEF DESCRIPTION OF DRAWINGS

FIG. 1 is a perspective view of a superconducting magnet assembly utilizing the present invention.

FIG. 2 is an end view of FIG. 1.

FIG. 3 is a side sectional view of FIG. 2 taken along the lines 3—3 of FIG. 2.

Figure 4:
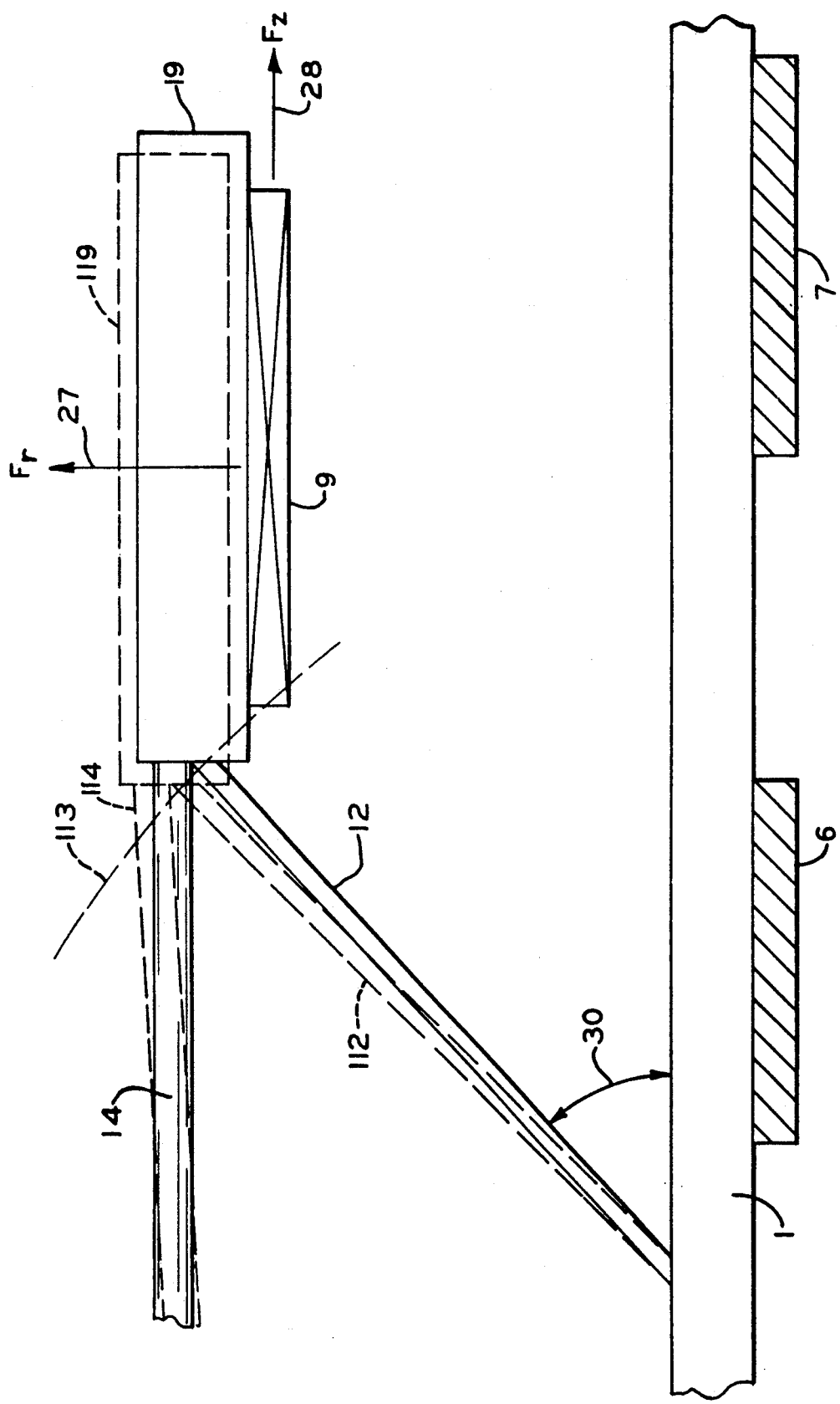
FIG. 4 is an enlarged portion of FIG. 3 illustrating the electromagnetic and gravitational forces applied to the support structure.

Referring first to FIGS. 1-3, a plurality of main magnet coils 2, 3, 4, 5, 6 and 7 are supported by the cylindrical drum 1 within machined pockets or grooves. Drum 1 is an annular cylindrical aluminum structure. Other materials may also be suitable. Concentrically surrounding portions of main magnet coils 2-7 and drum 1 is a pair of bucking coils 8 and 9. Bucking coils 8 and 9 are supported on bucking coil support cylinders or bands 18 and 19, respectively. Solenoidal main magnet coils 2-7 produce a highly uniform magnetic field of a large magnitude. However, since an MRI is often installed in hospitals which contain various electronic equipment and extraneous magnetic fields surrounding the MRI location, the equipment must be isolated from the MRI magnetic field and the MRI must be shielded from surrounding magnetic fields. Moreover, MRI systems require that the magnetic field inhomogeneity, within a central core region, be no more than several parts per million.

As best shown in FIG. 1, adjacent ends of spacer rods 14 and struts 12 are each connected to fastening member 16 which in turn are fastened to coil support cylinders 18 and 19 by suitable fastener 17. Fastening member 16 is generally U-shaped with the opposed legs or jaws of the U surrounding edges 28 and 29 of coil support cylinders 18 and 19, respectively.

Bucking magnet coils 8 and 9 carry currents in the opposite direction to that carried by main magnet coils 2-7 to provide cancellation of magnetic fields in the region outside the MRI. This actively shielded system avoids placing large amounts of iron around the MRI used in a passive system, and thus avoids the considerable weight and volume which would be added if a passive magnetic shielding system were used.

In accordance with a preferred embodiment of the present invention, the supports for bucking magnetic coils 8 and 9 include a plurality of struts or plates 12 extending angularly outward from drum 1, or from bands 13 around the drum, to bucking coil support cylinders 18 and 19 with spacing rods 14 extending axially between the bucking coil support cylinders. The struts 12, drum 1 and spacing rods 14 define a toroidal surface with a substantially isosceles trapezoidal cross section, as best shown in FIGS. 3 and 4. Referring to FIG. 4, in addition to FIGS. 1-3, it is to be noted that the struts or plates 12 extend outward from drum 1 at an angle of approximately 40°, forming a substantially isosceles trapezoidal cross section with the smaller of the parallel surfaces being axially along the surface of the drum.

As best shown in FIG. 3, the struts 12, in combination with spacer rods 14 and drum form a trapezoidal cross section. It has been found to be undesirable to utilize a continuous toroidal surface instead of struts 12 for a number of reasons. In the event of one or more of the superconducting coils quenching, that is, reverting from the superconducting to a normal (resistive) state, a significant portion of the magnetic energy stored in the magnet coils (typically several megajoules) will be rapidly "dumped," resulting in the high pressure helium gas in the cryostat becoming trapped by the toroidal surface in the space between the main magnetic coils 2-7 and bucking coils 8 and 9. In addition, a solid toroidal surface support would limit the location and interconnection of various components such as switches, resistors and diodes in the region between bucking magnet coils 8 and 9 and main magnetic coils 2-7, restricting the ability to utilize this space for the placement of such MRI components. As a result, it was determined that the present design for support of the bucking coils 8 and 9 was more practical, utilizing a plurality of struts or plates 12 in place of a continuous surface. In addition, this support arrangement eliminates weight of a solid toroidal surface. However, a continuous or solid apertured surface of a toroid could be utilized in place of struts 12 in the practice of the present invention.

FIG. 4 is useful in explaining the forces acting on the bucking magnet coils 8 and 9, and some of the advantages provided by the toroidal-cantilevered support of the present invention. Referring to FIGS. 3 and 4, when there is current flow through the six main magnet coils 2-7 and the two bucking coils 8 and 9, the interaction of the magnetic fields provides a radial force, indicated by arrow 27, on each bucking coil such as 9, and an axial force indicated by arrow 28. This force can be as great as 90,000 lbs. on bucking magnet coil 9, or some 700 lbs./sq. inch. The bucking coil supporting structure must not only withstand such large forces during energization of the magnet coils 2-7, 8 and 9, but also must withstand the significant thermal loads placed on the structure during cooldown from ambient temperatures to superconducting temperatures in the order of −270° C.

Moreover, precision positional accuracy is required, since MRI systems require inhomogeneity no greater than several parts per million over an approximately 50 centimeter diameter volume at the center of the magnet. That is, it is necessary to maintain the concentricity of bucking magnet coils 8 and 9 to within a few mils.

While conventional wisdom would indicate that the required structural support and concentricity could best be attained with supporting the coil support cylinders 18 and 19 rigidly to drum 1 with radial supports, various structural support arrangements have proved to be unacceptable when subjected to the various thermal and magnetic loadings of an MRI during operation. The use of rigid radial connections at one end of bucking support cylinder 18 resulted in unacceptably high flaring of the bucking coil resulting from rotation of the coil about the radial-cantilevered support. The use of radial supports at both axial ends of bucking coil support cylinders such as 18 and 19 solved the flaring problem, but introduced the problem of bulging of the bucking coil in the central region due to the outward radial load or force 27. While in theory the thickness of the bucking coil cylinder 18 could be increased until such bulging was reduced to tolerable limits, the thickness required and the resultant weight which must be supported are so large as to provide an impractical solution.

The toroidal-cantilevered support arrangement of the present invention has proven to be a design which meets the varying conflicting considerations and forces involved, and which provides the necessary rigidity and concentricity in the face of significant thermal and electromagnetic forces, while at the same time providing a relatively lightweight structure with considerable openness and space available for the placement of electronic and other components in the area between main magnetic coils 2-7 and bucking magnet coils 8 and 9.

As illustrated by FIG. 4, the toroidal surface 12, 14 provides stiffness which is resolved into two components, horizontal and vertical. The conical angle 30 between the struts 12 and housing 1 determines the proportion of the horizontal and vertical forces 27 and 28, respectively, within acceptably close limits. The angle 30 is in the range of 35° to 45°, with 40° being preferable. The bucking coil support cylinders or rings 18 and 19, to which the struts 12 and spacing rods 14 are attached, are subjected to large radially outward electromagnetic forces, similar to those on a cylindrical pressure vessel filled with high-pressure fluid. One effect of the strut 12-rod 14 combination is to restrain bucking coil cylinders or rings 18 and 19 from expanding radially outward at their points of connection. This, in turn, could cause circumferential variations of radial displacement which, if large enough, could cause structural failure and/or loss of homogeneity of the magnetic fields. Accordingly, a sufficient number of strut-rod junctions 12, 14 are provided to minimize circumferential variations. As best shown in FIG. 2, ten struts-rods 12, 14 are equally spaced with their centers 36° apart.

Since most MRI systems are operated with axis 11 horizontal, the effects of gravity must also be considered and minimized. That is, in addition to meeting the displacement criteria of bucking coils 8 and 9 under axisymmetric loading (primarily electromagnetic loads), MRI bucking coil magnets 8 and 9 should not sag appreciably under their own weight. This tendency is especially high in the case of the bucking coil cylinders or rings 18 and 19, which are supported at a distance from the drum 1. It is to be noted that the struts or plates 12 have a width in the azimuthal direction which is large compared to their thickness in the radial direction, minimizing the static deflection of the bucking coil rings 18 and 19 due to the effects of gravity. This aspect ratio of width to thickness of struts 12 also increases the torsional stiffness of the support structure, while keeping the radial stiffness low. Moreover, while the strut-rod combinations 12, 14 on their own form a beam element, the overall combination of struts and rods forms a toroidal truss system which provides additional stiffness against gravity loading.

Movement of the bucking magnet coil support 19, and magnet coil 9 carried thereon, is restrained within acceptable limits as shown (exaggerated) by the dotted lines 119 of FIG. 4. The exaggerated movement of strut 12 and spacing rod 14 is shown by dotted members 114 and 112, respectively, with slight rotational movement of strut 12 indicated by dotted arc 113. It is to be noted that the movement is restrained and that bucking magnet coil 9 moves essentially parallel to main magnet coils 2–7, maintaining homogeneity of the main magnetic field.

As a result, the present invention has proved to withstand extreme electromagnetic and thermal forces and loading, while maintaining the necessary concentricity and uniformity of magnetic field.

While the present invention has been described with respect to certain preferred embodiments thereof, it is to be understood that numerous variations in the details of construction, the arrangement and combination of parts, and the type of materials used may be made without departing from the spirit and scope of the invention.

What we claim is:

1. In an active magnetic shielding system for a superconducting magnet assembly located in a cryostat with at least one main magnet coil supported by a tubular drum and a plurality of bucking magnet coils supported concentrically about the drum and at a distance from the at least one main magnet coil, a support assembly for the bucking magnet coils comprising:
    an annular support for each of said bucking coils extending in an axial direction between end regions thereof;
    a plurality of radial struts secured at one end to said drum and at the remote end to one end region of said coil supports, providing a cantilevered support to the coil supports; and
    a plurality of rods extending between said coil supports.

2. A superconducting magnet coil assembly of claim 1 wherein said struts extend outward from said drum at an angle to the axis of said drum.

3. A superconducting magnet coil assembly of claim 2 wherein said spacing rods are secured to locations at the end regions of said coil supports proximate to where said radial struts are secured.

4. A superconducting magnet coil assembly of claim 3 wherein said plurality of bucking coil magnets is two bucking coil magnets, and said struts extend in opposite directions from the axial center of said drum, forming a toroidal surface with a substantially trapezoidal cross section.

5. A superconducting magnet coil assembly of claim 4 wherein a fastening member with at least one jaw is secured to the end of said struts to surround an end region of each of said coil supports, and means to fasten said fastening members to said coil supports.

6. A superconducting magnet coil assembly of claim 5 wherein said spacing rods extend between said fastening members.

7. A superconducting magnet coil assembly of claim 6 wherein said fastening member is generally U-shaped and includes a pair of opposed jaws dimensioned to fit around said end region on said coil supports.

8. A superconducting magnet coil assembly of claim 2 wherein groups of said struts extend in opposite axial directions to define, in combination with said rods and said drum, a substantially trapezoidal cross section between adjacent coil supports.

9. A superconducting magnet coil assembly of claim 8 wherein said angle is in the order of 35° to 45°.

10. A superconducting magnet coil assembly of claim 8 wherein the width of said struts in the azimuthal direction is large compared to the thickness of said struts in the radial direction.

11. A superconducting magnet coil assembly of claim 1 wherein said support structure forms a truss system which provides a substantially trapezoidal-toroid support structure for said coil supports.

12. A superconducting magnet coil assembly of claim 11 wherein said plurality of bucking coils is two bucking coils.

13. A superconducting magnet coil assembly of claim 12 wherein said trapezoidal-toroid support structure extends outward from the central region of said drum, and the trapezoid is an isosceles trapezoid.

14. A superconducting magnet coil assembly of claim 11 wherein there are in the order of ten struts connected to each coil support.

15. A superconducting magnet coil assembly of claim 14 wherein each strut is spaced from adjacent struts leaving axial openings between adjacent struts about said coil support.

16. A superconducting magnet coil assembly of claim 11 wherein one end of each of said struts and one end of each of said rods are contiguous and secured to a fastening member.

* * * * *